United States Patent
Schmenn et al.

(10) Patent No.: US 7,888,232 B2
(45) Date of Patent: Feb. 15, 2011

(54) METHOD FOR PRODUCING A PROTECTIVE STRUCTURE

(75) Inventors: Andre Schmenn, Sachsenkam (DE);
Damian Sojka, Regensburg (DE);
Carsten Ahrens, Pettendorf (DE)

(73) Assignee: Infineon Technologies AG, Neubiberg (DE)

( * ) Notice: Subject to any disclaimer, the term of this patent is extended or adjusted under 35 U.S.C. 154(b) by 338 days.

(21) Appl. No.: 12/120,401

(22) Filed: May 14, 2008

(65) Prior Publication Data

US 2008/0290462 A1 Nov. 27, 2008

(30) Foreign Application Priority Data

May 24, 2007 (DE) .................... 10 2007 024 355

(51) Int. Cl.
*H01L 21/76* (2006.01)
(52) U.S. Cl. ............... 438/400; 438/416; 438/418; 257/168; 257/546
(58) Field of Classification Search ......... 438/400, 438/416, 418, 419, 453; 257/168, 296, 362, 257/546, E26.334
See application file for complete search history.

(56) References Cited

U.S. PATENT DOCUMENTS

| | | | |
|---|---|---|---|
| 5,212,100 A * | 5/1993 | Groves et al. ............ 438/217 |
| 5,631,493 A | 5/1997 | Pezzani | |
| 6,191,466 B1 | 2/2001 | Yamashita et al. | |
| 6,194,764 B1 | 2/2001 | Gossner et al. | |
| 6,538,290 B1 * | 3/2003 | Ishikawa et al. ......... 257/362 |
| 7,081,662 B1 | 7/2006 | Lee et al. | |
| 7,301,202 B2 * | 11/2007 | Kouzuki et al. ............ 257/335 |
| 7,619,262 B2 * | 11/2009 | Glenn et al. ............ 257/168 |
| 2003/0168682 A1 * | 9/2003 | Mettler et al. ............ 257/296 |
| 2005/0199981 A1 | 9/2005 | Walters | |
| 2006/0292809 A1 * | 12/2006 | Enicks et al. ............ 438/350 |
| 2007/0120150 A1 * | 5/2007 | Meyer et al. ............ 257/213 |

FOREIGN PATENT DOCUMENTS

| | | |
|---|---|---|
| CN | 1913148 A | 2/2007 |
| EP | 0635886 A1 | 1/1995 |

OTHER PUBLICATIONS

Semtech, RClamp0544M Railclamp ESD Protection for HDMI Interfaces, Revision Jan. 19, 2006.
STMicroelectronics, HDMIULC6-4SC6, Ultra large bandwidth ESD protection, Jul. 2006.

* cited by examiner

*Primary Examiner*—Phuc T Dang
(74) *Attorney, Agent, or Firm*—Dickstein Shapiro LLP

(57) ABSTRACT

A protective structure is produced by providing a semiconductor substrate with a doping of a first conductivity type. A semiconductor layer with a doping of a second conductivity type is applied at a surface of the semiconductor substrate. A buried layer with doping of a second conductivity type is formed in a first region of the semiconductor layer, wherein the buried layer is produced at the junction between the semiconductor layer and semiconductor substrate. A first dopant zone with a doping of a first conductivity type is formed in the first region of the semiconductor layer above the buried layer. A second dopant zone with a doping of a second conductivity type is formed in a second region of the semiconductor layer. An electrical insulation is formed between the first region and the second region of the semiconductor layer. A common connection device is formed for the first dopant zone and the second dopant zone.

17 Claims, 2 Drawing Sheets

METHOD FOR PRODUCING A PROTECTIVE STRUCTURE

CROSS-REFERENCE TO RELATED APPLICATION

This application claims priority to German Patent Application Serial No. DE 10 2007 024 355.5, which was filed May 24, 2007, and is incorporated herein by reference in its entirety.

FIELD OF THE INVENTION

Exemplary embodiments of the invention relate to a method for producing a protective structure, and the protective structure.

BACKGROUND OF THE INVENTION

Electrostatic discharges (ESD) can severely damage semiconductor components. Therefore, ESD protective concepts are realized in most semiconductor components nowadays. The ESD protective components integrated in the chip define a current path via which the ESD current can flow without causing damage.

In the case of high-speed data transmission lines, in particular, the requirement exists of ensuring an ESD protection up to 15 kV without the signal waveform being distorted to an excessively great extent. For this purpose, the protective element must have a particularly low capacitance.

Known ESD protective structures have structures that are complicated and have inaccurate producability on account of the high substrate thickness for the diode arrangement. The dopant diffusion through the complete substrate thickness leads to inaccuracies and a high space requirement owing to the lateral outdiffusion that likewise takes place. The high substrate thickness brings about a high resistance, which adversely affects the performance of the protective structure.

BRIEF DESCRIPTION OF THE FIGURES

Exemplary embodiments of the invention are explained in more detail below, referring to the accompanying figures. However, the invention is not restricted to the embodiments described in concrete fashion, but rather can be modified and adapted in a suitable manner. It lies within the scope of the invention to combine individual features and feature combinations of one embodiment with features and feature combinations of another embodiment in a suitable manner in order to attain further embodiments according to the invention.

In the figures.

DETAILED DESCRIPTION OF THE INVENTION

Figure 1:
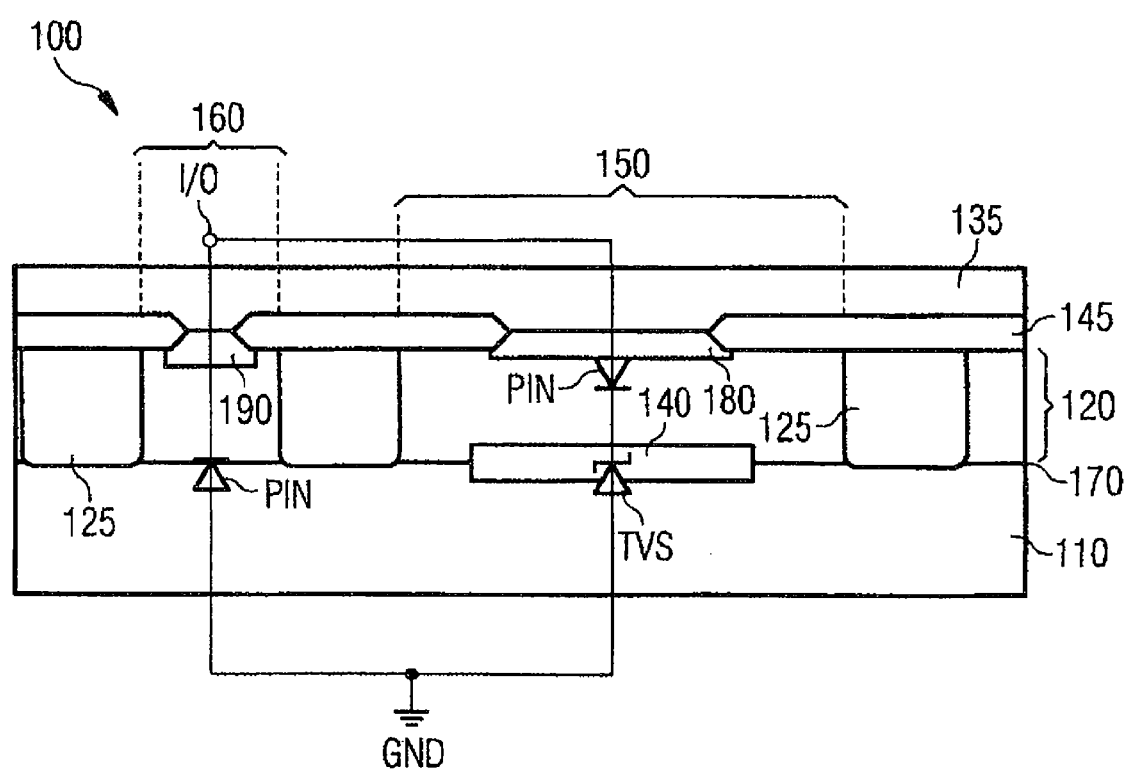
FIG. 1 shows a schematic cross-sectional view of a protective structure.

The present invention specifies a cost-effective method for producing a protective structure having a high performance.

Embodiments of the invention generally relate to a method for producing a protective structure which involves providing a semiconductor substrate with a doping of a first conductivity type, applying a semiconductor layer with a doping of a second conductivity type at a surface of the semiconductor substrate, forming a buried layer with a doping of a second conductivity type in a first region of the semiconductor layer, wherein the buried layer is produced at the junction between the semiconductor layer and the semiconductor substrate, forming a first dopant zone with a doping of a first conductivity type in the first region of the semiconductor layer above the buried layer, forming a second dopant zone with a doping of a second conductivity type in a second region of the semiconductor layer, forming an electrical insulation between the first region and the second region of the semiconductor layer, and forming a common connection device for the first dopant zone and the second dopant zone.

By forming an adapted semiconductor layer, it is possible for the thickness of said semiconductor layer to be restricted to the bare essentials. A small semiconductor layer thickness, however, permits a reduction of the structure widths and lengths, in particular by virtue of shorter process times such as e.g. outdiffusions, which leads to cost savings.

Moreover, the resistance of a current flowing through the protective structure is lowered by a small semiconductor layer thickness, which means a low clamping voltage and therefore improves the performance of the protective structure.

Embodiments of the invention specifically relate to a method for producing a protective structure which involves providing a semiconductor base substrate with a doping of a first conductivity type, producing a first epitaxial layer on the semiconductor base substrate, implanting a dopant of the second conductivity type in a delimited implantation region of the first expitaxial layer, applying a second epitaxial layer with doping of a second conductivity type on the first epitaxial layer, forming insulation zones in the second epitaxial layer, such that the second epitaxial layer is subdivided into a first region and into a second region, producing a first dopant zone with a doping of a first conductivity type in the first region above the implantation region, producing a second dopant zone with a doping of a second conductivity type in the second region, outdiffusing the dopant from the implantation region in order to form a buried layer at the junction between the first epitaxial layer and the first region of the second epitaxial layer.

By means of the first epitaxial layer, in particular by means of the thickness thereof, it is possible to adapt to the requirements the junction between first and second conductivity type in the first epitaxial layer, especially with regard to the breakdown voltage of the PN junction.

The thickness of the second epitaxial layer once again determines the costs and the performance of the protective structure, which can lead to improvements through corresponding adaptation of the second epitaxial layer.

Before the exemplary embodiments of the present invention are explained in more detail below with reference to the figures, it is pointed out that identical elements in the figures are provided with identical or similar reference symbols, and repeated description of said elements is omitted.

FIG. 1 illustrates a first embodiment of a protective structure 100 produced according to the method according to the invention. A semiconductor layer 120 is applied on a surface of a semiconductor substrate 110 provided, said substrate having a doping of a first conductivity type. The semiconductor layer 120 has a doping of a second conductivity type. The dopant concentration of the semiconductor layer 120 is kept as low as possible in order to achieve a minimal capacitive disturbing effect of the protective structure. Therefore, the dopant concentration of the semiconductor layer should not exceed $1*10^{15}$ cm$^{-3}$. The semiconductor layer 120 is produced epitaxially, for example. In particular, the semiconductor layer 120 is produced with a thickness d1 of $2\ \mu m \leq d1 \leq 20\ \mu m$.

The semiconductor substrate 110 has a dopant concentration of at least $1 \times 10^{18}$ cm$^{-3}$, while the semiconductor layer 120 is produced with a lower dopant concentration than the semiconductor substrate 110.

A buried layer 140 with a doping of a second conductivity type is formed in a first region 150 of the semiconductor layer 120. The buried layer 140 is produced at the junction 170 between the semiconductor layer 120 and the semiconductor substrate 110. This is done for example by implantation of a dopant at the surface of the semiconductor substrate 110 and subsequent outdiffusion of the dopant into the semiconductor layer 120.

As an alternative, the dopant can also be provided in the form of a deposited layer on the semiconductor substrate 120.

The provision of dopant for the buried layer 140 is generally effected before the semiconductor layer 120 is produced on the semiconductor substrate 110. In this case, the buried layer 140 is formed with a higher dopant concentration that the semiconductor layer 120.

The annealing of the dopants in order to form the buried layer is effected over a time period of $1 \leq t \leq 30$ minutes at a temperature T of $1000°$ C.$\leq T \leq 1200°$ C., in particular 5 minutes at $1150°$ C.

As dopant for the buried layer 140, boron is appropriate as P-type dopant and As, P are appropriate as N-type dopant.

The buried layer 140 with a dopant of a second conductivity type forms together with the semiconductor substrate 110 a PN junction, that is to say a diode, in particular a TVS (transient voltage suppressor) diode.

Above the buried layer 140, a first dopant zone 180 with a doping of a first conductivity type is formed in the first region 150 of the semiconductor layer 120. For this purpose, by way of example, the dopant is implanted into the semiconductor layer 120 and subsequently activated and outdiffused. The outdiffusion takes place over a time period t2 of approximately 10 seconds at $950°$ C. in order to obtain a first diffusion zone 180 that is as narrow as possible.

Part of the semiconductor layer 120 remains between the first dopant zone 180 and the buried layer 140. The layer sequence composed of a first dopant zone 180 with a doping of a first conductivity type, semiconductor layer 120 with a very low doping of a second conductivity type and buried layer 140 with a doping of a second conductivity type forms a PIN or NIP diode. The buried layer 140 is therefore used firstly as part of the PIN/NIP diode and secondly as part of the TVS diode. PIN/NIP diode and TVS are connected in series in this case.

A second dopant zone 190 with a doping of second conductivity type is formed in a second region 160 of the semiconductor layer 120. The formation can likewise be effected by implantation of a dopant and subsequent activation and outdiffusion of the dopant. The outdiffusion time is once again set in such a way that a second dopant zone 190 that is as narrow as possible arises. This saves time, space and thus also costs.

The second dopant zone 190 is produced in the same way as the first dopant zone 180 at that side of the semiconductor layer 120 which is near the surface. Consequently, part of the semiconductor layer 120 also remains between second dopant zone 190 and semiconductor substrate 110. As a result, the layer sequence of second dopant zone 190 with a doping of the second conductivity type, semiconductor layer 120 with a very low doping of a second conductivity type and semiconductor substrate 110 with a doping of the first conductivity type forms a PIN or NIP diode.

The first region 150 and the second region 160 are arranged alongside one another in the semiconductor layer 120. Consequently, the series-connected diode arrangement in the first region 150 is in parallel with the PIN/NIP diode in the second region. The PIN/NIP diode in the first region 150 is biased in the opposite direction to the NIP/PIN diode in the second region 160.

Electrical insulation structures 125 are formed in the semiconductor layer 120, which insulation structures laterally delimit the first region 150 and the second region 160 and isolate them from one another. In this case, the electrical insulation 125 is formed with a depth such that it extends from the surface of the semiconductor layer 120 at least as far as the semiconductor substrate 110 through the semiconductor layer 120. The electrical insulation 125 can be produced in a manner that is all the more rapid and saves space all the more, the smaller the layer thickness d1 chosen for the semiconductor layer 120.

By way of example, the electrical insulation 125 is produced by implantation and outdiffusion of a dopant of a first conductivity type. Since the outdiffusion is intended to be effected through the entire semiconductor layer 120, long diffusion times are necessary in the case of a large semiconductor layer thickness d1. In this case, the dopant will also out diffuse laterally, which leads to a significant widening of the structures and the space requirement therefore rises. Long production times and a large space requirement are critical factors for higher costs, however. Therefore, the layer thickness d1 of the semiconductor layer should be kept as small as possible. On the other hand, the parasitic capacitance of the PIN/NIP diodes is increased by a small layer thickness, which leads to higher disturbing influences such as e.g. distortions of the signals in the application of the protective structure. Consequently, the thickness d1 of the semiconductor layer must be chosen in such a way as to achieve a compromise between capacitance and production costs. This compromise currently lies at a layer thickness d1$\approx$8 µm. For the outdiffusion of the dopant through the semiconductor layer 120, diffusion times of 60 minutes at a diffusion temperature of $1150°$ are necessary for this.

As an alternative, the electrical insulation 125 can also be produced by producing a trench through the semiconductor layer 120. Said trench can in particular also be at least partly filled with electrically insulating material. In this case, too, the dimension of the trench is influenced by the layer thickness d1 of the semiconductor layer 120. In order to produce a deep trench, the width of the trench has to be increased. Consequently, a thick semiconductor layer also affects the width of the trench, which leads to a higher space requirement for the insulation and therefore likewise increases the costs.

A common connection device 135 is formed for the fist dopant zone 180 and the second dopant zone 190. This is done for example by producing an insulation layer 145, such as an oxide layer, for example, on the semiconductor layer 120. In said insulation layer 145, openings are formed above the first dopant zone 180 and above the second dopant zone 190. The electrically conductive connection structure 135, such as a metal layer or a polysilicon layer, for example, is then produced on the insulation layer 145 and in the openings. The connection device 145 therefore makes contact with the first dopant zone 180 and the second dopant zone 190.

FIG. 1 schematically outlines a circuit in order to illustrate the functioning of the protective structure. If a negative voltage is present for example at the input node I/O then the current will flow away to ground GND via the PIN diode of the second region 160. By contrast, if a positive voltage is present at the I/O, then the PIN diode of the second region 160 is reverse-biased and the current is conducted through the forward-biased PIN diode in the first region 150. However, a current will flow only when the voltage of the initially turned-off TVS diode exceeds the threshold voltage. As soon as said voltage is exceeded, the TVS diode starts to conduct and the current can flow away via the first region 180 to the ground connection GND at the rear side of the semiconductor substrate 110. Consequently, the circuit in which the protective structure 100 is integrated is protected against over voltages that are greater than the threshold voltage of the TVS diode.

Figure 2:
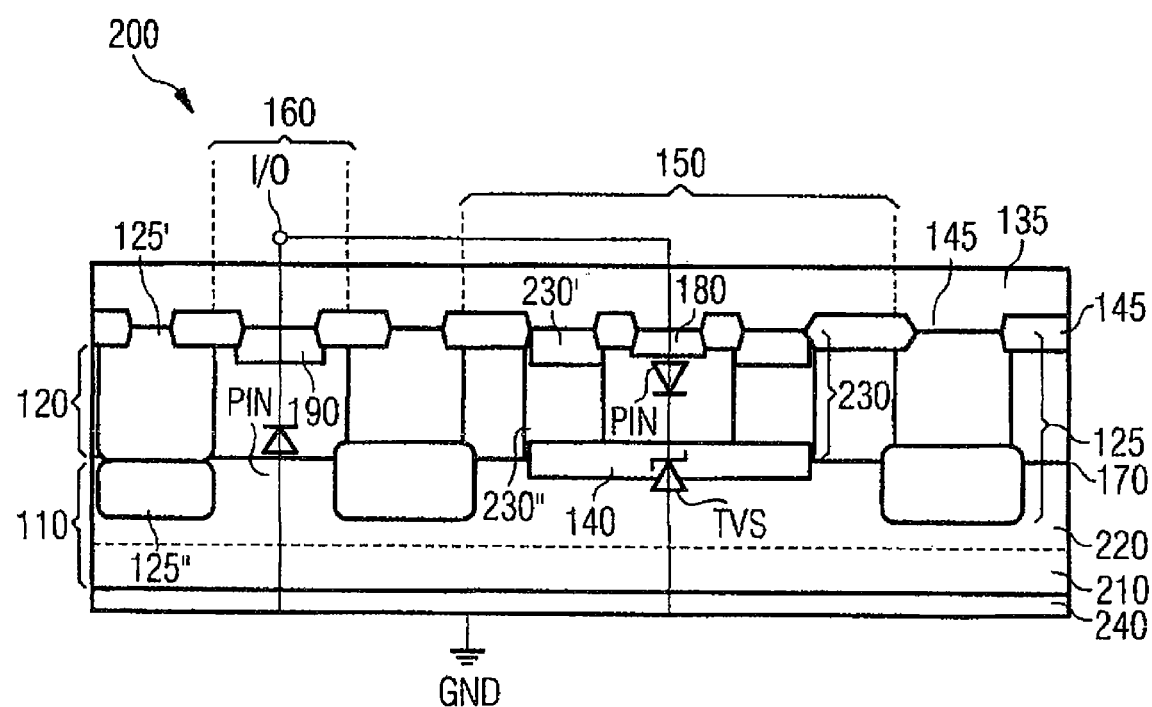
FIG. 2 shows a schematic cross-sectional view of a further embodiment of the protective structure.

FIG. 2 shows a further embodiment of a protective structure according to the invention.

The protective structure 200 has developments of the protective structure 100 from FIG. 1. Thus, by way of example, the semiconductor substrate 110 is composed of a semiconductor base substrate 210 and an intrinsic layer 220 produced thereon.

The intrinsic layer 220 is produced epitaxially, for example, and has no or only a very low doping of an arbitrary conduction type.

By contrast, the semiconductor base substrate 210 has a very high doping with a dopant of a first conductivity type. Subsequent thermal steps cause the doping to out diffuse from the semiconductor base substrate 210 into the intrinsic layer 220.

In this case, the intrinsic layer 220 acts as a buffer layer for the outdiffusion from the semiconductor base substrate 210. The thicker the intrinsic layer 220, the further the dopant out diffuses from the semiconductor base substrate 210 to the pn junction. As a result, the junction takes place at lower, flatter doping profiles, which leads to an increase in the breakdown voltage. Consequently, the breakdown voltage of the TVS diode can be set by the thickness of the intrinsic layer 220.

Moreover, the electrical insulation is produced in a two-part process in the protective structure 200 as a development of the protective structure 100. In this case, firstly a dopant is implanted into the semiconductor substrate 110. After the semiconductor layer 120 has been produced, dopant is once again implanted, but now into the semiconductor layer 120. The dopant is subsequently outdiffused, which leads to the formation of two dopant regions 125' and 125" lying one above another, which together produce the electrical insulation 125. As a result, it is possible to produce for example deeper electrical insulation 125 right into the semiconductor substrate 110.

A further development of the method according to the invention is that at least one connecting zone 230 is formed between the connection device 135 and the buried layer 140. Consequently, the buried layer can be allocated a bias voltage, for example. For this purpose, the connecting zone 230 is formed for example with a dopant of a second conductivity type and with a dopant concentration $k_v > 1 \times 10^{17}$ cm$^{-3}$. Moreover, the connecting zone can be formed in two-part form with two zones 230' and 230" lying one above another.

Moreover, the protective structure 200 has by comparison with the protective structure 100 the development that a metallic layer 240 is produced at the rear side of the semiconductor substrate 110, which metallic layer can be used as a substrate connection.

However, the substrate connection can also be led to the surface via the electrical insulation 125 (p-type sinker), whereby for example a WLP package also becomes possible.

All the developments in the protective structure 200 can be made individually or in combination, which respectively leads to further embodiments of the invention.

As already explained with regard to FIG. 1, FIG. 2 once again shows the schematic circuit diagram with the diodes forming the protective structure.

What is claimed is:

1. A method for producing a protective structure, the method comprising:
    providing a semiconductor substrate with a doping of a first conductivity type;
    applying a semiconductor layer with a doping of a second conductivity type at a surface of the semiconductor substrate;
    forming a buried layer with a doping of a second conductivity type in a first region of the semiconductor layer, wherein the buried layer is produced at the junction between the semiconductor layer and the semiconductor substrate;
    forming a first dopant zone with a doping of a first conductivity type in the first region of the semiconductor layer above the buried layer;
    forming a second dopant zone with a doping of a second conductivity type in a second region of the semiconductor layer;
    forming an electrical insulation between the first region and the second region of the semiconductor layer; and
    forming a common connection device for the first dopant zone and the second dopant zone.

2. The method as claimed in claim 1, wherein the semiconductor layer is produced epitaxially.

3. The method as claimed in claim 1, wherein the semiconductor layer is produced with a thickness d1 of 2 µm≦d1≦20 µm.

4. The method as claimed in claim 1, wherein the semiconductor layer is produced with a dopant concentration $k \leq 1 \times 10^{15}$ cm$^{-3}$.

5. The method as claimed in claim 1, wherein the semiconductor layer is produced with a lower dopant concentration than the semiconductor substrate.

6. The method as claimed in claim 1, wherein the semiconductor substrate is provided with an intrinsic layer at the surface.

7. The method as claimed in claim 6, wherein the intrinsic layer has a thickness d2 where 0≦d2≦8 µm.

8. The method as claimed in claim 1, wherein the buried layer is formed with a higher dopant concentration than the semiconductor layer.

9. The method as claimed in claim 1, wherein the buried layer is produced by outdiffusion of a highly doped dopant zone.

10. The method as claimed in claim 9, wherein the highly doped dopant zone is implanted at the surface of the semiconductor substrate.

11. The method as claimed in claim 9, wherein the highly doped dopant zone is deposited on the surface of the semiconductor substrate.

12. The method as claimed in claim 1, wherein the electrical insulation is formed from the surface of the semiconductor layer at least as far as the semiconductor substrate.

13. The method as claimed in claim 1, wherein the electrical insulation is produced by outdiffusion of a dopant of the first conductivity type.

14. The method as claimed in claim 1, wherein the electrical insulation is produced by forming a trench.

15. The method as claimed as claim 14, wherein the trench is at least partly filled with an electrically insulated material.

16. The method as claimed in claim 1, wherein at least one connecting zone is formed between the connection device and the buried layer.

17. The method as claimed in claim 16, wherein the connecting zone is formed with a dopant of a second conductivity type and with a dopant concentration $k_v > 1 \times 10^{17}$ cm$^{-3}$.

* * * * *